(12) United States Patent
Rizza et al.

(10) Patent No.: US 9,986,631 B2
(45) Date of Patent: May 29, 2018

(54) ELECTRONIC POWER MODULE WITH ENHANCED THERMAL DISSIPATION AND MANUFACTURING METHOD THEREOF

(71) Applicant: STMICROELECTRONICS S.R.L., Agrate Brianza (IT)

(72) Inventors: Roberto Rizza, Syracuse (IT); Agatino Minotti, Mascalucia (IT); Gaetano Montalto, Trecastagni (IT); Francesco Salamone, Acireale (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days. days.

(21) Appl. No.: 15/081,464

(22) Filed: Mar. 25, 2016

(65) Prior Publication Data

US 2017/0064808 A1 Mar. 2, 2017

(30) Foreign Application Priority Data

Sep. 2, 2015 (IT) ........................ 102015000048069

(51) Int. Cl.
*H05K 7/20* (2006.01)
*H05K 1/02* (2006.01)
(Continued)

(52) U.S. Cl.
CPC ......... *H05K 1/0203* (2013.01); *H01L 23/053* (2013.01); *H01L 23/08* (2013.01);
(Continued)

(58) Field of Classification Search
CPC . G06F 1/181–1/182; H05K 7/20218–7/20381;
(Continued)

(56) References Cited

U.S. PATENT DOCUMENTS 5,297,006 A * 3/1994 Mizukoshi .......... H01L 25/0652
165/80.3
2004/0056346 A1 3/2004 Palm et al.
(Continued)

FOREIGN PATENT DOCUMENTS

FR 2 786 657 A1 2/2000
GB 2485087 A 5/2012
(Continued)

OTHER PUBLICATIONS

Gillot et al., "Double-Sided Cooling for High Power IGBT Modules Using Flip Chip Technology," *IEEE Transactions on Components and Packaging Technologies* 24(4): 698-704, 2001.
(Continued)

*Primary Examiner* — Anthony Haughton
*Assistant Examiner* — Razmeen Gafur
(74) *Attorney, Agent, or Firm* — Seed IP Law Group LLP

(57) ABSTRACT

An electronic power module comprising a case that houses a stack, which includes: a first substrate of a DBC type or the like; a die, integrating an electronic component having one or more electrical-conduction terminals, mechanically and thermally coupled to the first substrate; and a second substrate, of a DBC type or the like, which extends over the first substrate and over the die and presents a conductive path facing the die. The die is mechanically and thermally coupled to the first substrate by a first coupling region of a sintered thermoconductive paste, and the one or more conduction terminals of the electronic component are mechanically, electrically, and thermally coupled to the conductive path of the second substrate by a second coupling region of sintered thermoconductive paste.

20 Claims, 13 Drawing Sheets

(51) Int. Cl.
  H01L 23/373    (2006.01)
  H01L 23/498    (2006.01)
  H01L 23/538    (2006.01)
  H01L 25/07     (2006.01)
  H01L 23/053    (2006.01)
  H01L 23/08     (2006.01)
  H01L 23/29     (2006.01)
  H01L 23/31     (2006.01)
  H01L 23/34     (2006.01)
  H01L 23/367    (2006.01)
  H01L 23/00     (2006.01)
  H01L 25/18     (2006.01)
  H01L 25/00     (2006.01)
  H05K 1/11      (2006.01)
  H05K 3/10      (2006.01)
  H05K 7/14      (2006.01)
  H05K 13/00     (2006.01)
  H01L 23/24     (2006.01)
  H01L 23/36     (2006.01)
  H01L 23/473    (2006.01)
  H01L 23/492    (2006.01)

(52) U.S. Cl.
  CPC ............ H01L 23/24 (2013.01); H01L 23/296
  (2013.01); H01L 23/3114 (2013.01); H01L
  23/34 (2013.01); H01L 23/36 (2013.01);
  H01L 23/3675 (2013.01); H01L 23/3735
  (2013.01); H01L 23/3737 (2013.01); H01L
  23/49811 (2013.01); H01L 23/49833
  (2013.01); H01L 23/49838 (2013.01); H01L
  23/5385 (2013.01); H01L 24/27 (2013.01);
  H01L 24/33 (2013.01); H01L 24/83 (2013.01);
  H01L 25/072 (2013.01); H01L 25/18
  (2013.01); H01L 25/50 (2013.01); H05K
  1/115 (2013.01); H05K 3/10 (2013.01); H05K
  7/1427 (2013.01); H05K 13/0023 (2013.01);
  H01L 23/492 (2013.01); H01L 2224/29139
  (2013.01); H01L 2224/32227 (2013.01); H01L
  2224/33181 (2013.01); H01L 2224/40225
  (2013.01); H01L 2224/8384 (2013.01); H01L
  2224/83192 (2013.01); H01L 2924/1203
  (2013.01); H01L 2924/13055 (2013.01); H01L
  2924/15153 (2013.01); H01L 2924/19107
  (2013.01); H05K 2201/06 (2013.01)

(58) Field of Classification Search
  CPC ............. H05K 7/20409–7/20418; H05K
  7/20009–7/202; H01L 23/367–23/3677;
  H01L 23/473; H01L 23/46–23/467
  USPC ...... 361/676–678, 679.46–679.54, 688–723;
  165/80.1–80.5, 104.33, 185;
  174/15.1–15.3, 16.1–16.3, 547, 548;
  257/712–722, E23.088; 24/453, 458–459;
  454/184; 312/236
  See application file for complete search history.

(56) References Cited

U.S. PATENT DOCUMENTS

| | | | | |
|---|---|---|---|---|
| 2008/0278918 A1* | 11/2008 | Tominaga | ............ | B62D 5/0406 361/719 |
| 2011/0026232 A1* | 2/2011 | Lin | ............ | H01L 21/76898 361/760 |
| 2011/0037166 A1* | 2/2011 | Ikeda | ............ | H01L 23/3735 257/712 |
| 2011/0104828 A1* | 5/2011 | Balucani | ............ | H01L 21/6835 438/3 |
| 2011/0104856 A1* | 5/2011 | Lin | ............ | H05K 1/0204 438/118 |
| 2012/0063094 A1* | 3/2012 | Gaynes | ............ | H05K 1/0206 361/707 |
| 2012/0129299 A1* | 5/2012 | Lin | ............ | H01L 21/4878 438/118 |
| 2013/0044431 A1* | 2/2013 | Koeneman | ............ | H01L 23/473 361/699 |
| 2013/0062750 A1* | 3/2013 | Lenniger | ............ | H01L 23/473 257/691 |
| 2013/0134572 A1* | 5/2013 | Lenniger | ............ | H01L 23/367 257/690 |
| 2013/0170142 A1* | 7/2013 | Weaver, Jr. | ............ | H01L 23/427 361/701 |
| 2013/0221526 A1* | 8/2013 | Lange | ............ | H01L 21/50 257/750 |
| 2013/0286592 A1* | 10/2013 | Tsuduki | ............ | H01L 23/055 361/707 |
| 2014/0036444 A1* | 2/2014 | Nishio | ............ | H05K 7/20563 361/695 |
| 2014/0077354 A1* | 3/2014 | Yamamoto | ............ | H02M 7/003 257/712 |
| 2014/0085829 A1* | 3/2014 | Yamashita | ............ | H05K 1/0204 361/717 |
| 2014/0198449 A1* | 7/2014 | Osada | ............ | H05K 7/20927 361/689 |
| 2014/0198454 A1* | 7/2014 | Yuan | ............ | H05K 7/209 361/720 |
| 2014/0231126 A1* | 8/2014 | Hunrath | ............ | H05K 3/4614 174/264 |
| 2014/0233188 A1* | 8/2014 | Terasawa | ............ | H05K 7/1432 361/719 |
| 2014/0246783 A1 | 9/2014 | Nishizawa et al. | | |
| 2014/0246785 A1* | 9/2014 | Yu | ............ | H01L 25/105 257/774 |
| 2014/0268578 A1* | 9/2014 | Dolci | ............ | H05K 9/0049 361/719 |
| 2014/0362537 A1* | 12/2014 | Yoon | ............ | H05K 7/209 361/716 |
| 2015/0116945 A1* | 4/2015 | Minamio | ............ | H01L 23/4006 361/709 |
| 2015/0214189 A1 | 7/2015 | Tan et al. | | |
| 2015/0348869 A1* | 12/2015 | Joshi | ............ | H01L 23/4735 361/700 |
| 2015/0359132 A1* | 12/2015 | Campbell | ............ | H05K 7/20236 361/700 |
| 2016/0133558 A1* | 5/2016 | Stahr | ............ | H01L 23/36 257/692 |
| 2016/0141208 A1* | 5/2016 | Joachim | ............ | H01L 24/03 438/114 |
| 2016/0225744 A1* | 8/2016 | Nam | ............ | H01L 25/0657 |

FOREIGN PATENT DOCUMENTS

| | | |
|---|---|---|
| JP | 2014-175454 A | 9/2014 |
| JP | 2015-41716 A | 3/2015 |
| WO | 2013/005474 A1 | 1/2013 |

OTHER PUBLICATIONS

Zhang et al., "A High Temperature, Double-sided Cooling SiC Power Electronics Module," *IEEE Energy Conversion Congress and Exposition*: 2877-2883, 2013.

* cited by examiner

ELECTRONIC POWER MODULE WITH ENHANCED THERMAL DISSIPATION AND MANUFACTURING METHOD THEREOF

BACKGROUND

Technical Field

The present disclosure relates to an electronic power module provided with a packaging structure with enhanced thermal dissipation and to a method for manufacturing the electronic power module.

Description of the Related Art

As is known, in the manufacture of semiconductor devices, packaging is the final step that transforms a processed substrate, including electronic or electromechanical functional elements, into a component that may be mounted on a printed circuit board (PCB). The package provides a protection for the substrate and provides the electrical connections through which it is possible to supply signals to the functional elements and acquire signals coming therefrom.

To provide for an ever-increasing integration and reduction in size, the packaging methods currently used include wafer-level packaging (WLP) and 3D packaging. Further solutions envisage surface-mount devices (SMDs), which enable a further reduction of the dimensions of the package and the assembly costs.

In addition to the contained dimensions, the package, in particular for power devices, may guarantee supply of peak powers of some kilowatts and at the same time dissipation of several hundreds of watts. The package for power devices should consequently meet precise specifications both as regards the materials used and as regards the mutual arrangement of the elements that make then up. In the prior art it is known to provide an electronic device 1 of the type illustrated in lateral cross-sectional view in FIG. 1, where a case 10, provided with a side wall 2, typically of plastic material, and with a base plate 4, typically of copper, houses inside it a three-dimensional assembly comprising a bottom substrate 6, one or more dice 8 arranged on the bottom substrate 6, and a top substrate 9, which extends over the dice 8. The top substrate 9 is mechanically and electrically coupled to the bottom substrate 6 by solder balls 12. Likewise, also the dice 8 are arranged in appropriate housings of the bottom substrate 6 and are mechanically and electrically coupled to conductive paths of the top substrate 9 by solder balls 13. The dice 8 are coupled to the bottom substrate 6 by a lead-free solder paste or solder pre-form, typically made up of a SnAgCu alloy.

According to one embodiment, the dice 8 integrate, respectively, an IGBT and a diode, operatively coupled together in antiparallel configuration. The top substrate 9 and the bottom substrate 6 are of a direct-bonded-copper (DBC) type (or the like). DBC technology has been developed to provide for direct bonding of ceramic substrates with relatively thick copper laminas, without the addition of further bonding materials. DBC substrates are typically used for power circuits/modules. In greater detail, the DBC substrate is constituted by an insulating layer of ceramic material, typically alumina ($Al_2O_3$) or aluminum nitride (AlN), to which two metal layers are made to adhere, in particular of pure copper (Cu-OFE: 99.99%), in the form of laminas, by a high-temperature process. The final result is an intimate bonding between the copper laminas and the intermediate ceramic layer. Currently, this type of substrate is widely used for mounting components in electronic power circuits in so far as the intermediate ceramic layer guarantees good electrical insulation but at the same time enables good transfer of heat outwards. The conductive paths for connection of the components mounted on said substrates are obtained by etching the copper layer until the insulating ceramic layer is reached, thus forming conductive regions (paths) insulated from one another.

However, the use of the solder balls for mutual coupling between the substrates and for coupling between the dice and the substrates is the cause of an excessive thickness of the resulting stack, as well as of introduction of parasitic effects that are generated on account of the presence of the melting regions between the balls and the substrates.

Furthermore, embodiments of a known type entail long process steps in terms of manufacturing time, causing a reduction of the production efficiency.

BRIEF SUMMARY

Some embodiments of the disclosure are an electronic power module equipped with a packaging structure with enhanced thermal dissipation, and a method for manufacturing the electronic power module that overcomes disadvantages of known solutions.

According to one embodiment the present disclosure, an electronic power module includes a case and a stack housed by the case. The stack includes a first substrate, a first die, a second substrate, a first coupling region, and a second coupling region. The first substrate includes a first top metal region, a first bottom metal region, and a first insulating region arranged between the first top metal region and the first bottom metal region. The first die integrates a first electronic component having one or more electrical-conduction terminals, the first die being mechanically and thermally coupled to a first face of the first substrate. The second substrate includes a second top metal region, a second bottom metal region, and a second insulating region arranged between the second top metal region and the second bottom metal region, and the second substrate extends over the first substrate and over the first die and has a first conductive path in the second bottom metal region. The first coupling region is of a sintered thermoconductive paste and mechanically and thermally couples the first die to the first substrate. The second coupling region is also of sintered thermoconductive paste and mechanically, electrically, and thermally couples the one or more conduction terminals of the first electronic component to the first conductive path of the second substrate.

One embodiment of the present disclosure is a manufacturing method of an electronic power module. The method provides a first substrate, mechanically and thermally couples a first die to a first face of the first substrate, and arranges a second substrate on the first substrate and on the first die. The first substrate includes a first top metal region, a first bottom metal region, and a first insulating region arranged between the first top metal region and the first bottom metal region. The first die integrates a first electronic component having one or more electrical conduction terminals. Mechanically and thermally coupling the first die to the first substrate includes dispensing a first layer of thermoconductive paste on the first substrate and sintering the first layer of thermoconductive paste. The second substrate includes a second top metal region, a second bottom metal region, and a second insulating region arranged between the second top metal region and the second bottom metal region, and the second bottom region includes a first conductive path. The method also includes coupling mechanically, electrically, and thermally the one or more conduction terminals of the first electronic component and the first conductive path by steps including:

dispensing a second layer of thermoconductive paste on the first die exclusively in areas corresponding to said one or more conduction terminals of the first electronic component;

arranging the first conductive path in contact with the second layer of thermoconductive paste; and sintering the second layer of thermoconductive paste.

BRIEF DESCRIPTION OF THE SEVERAL VIEWS OF THE DRAWINGS

For an understanding of the present disclosure, preferred embodiments thereof are now described, purely by way of non-limiting example, with reference to the attached drawings, wherein.

DETAILED DESCRIPTION

Figure 1:
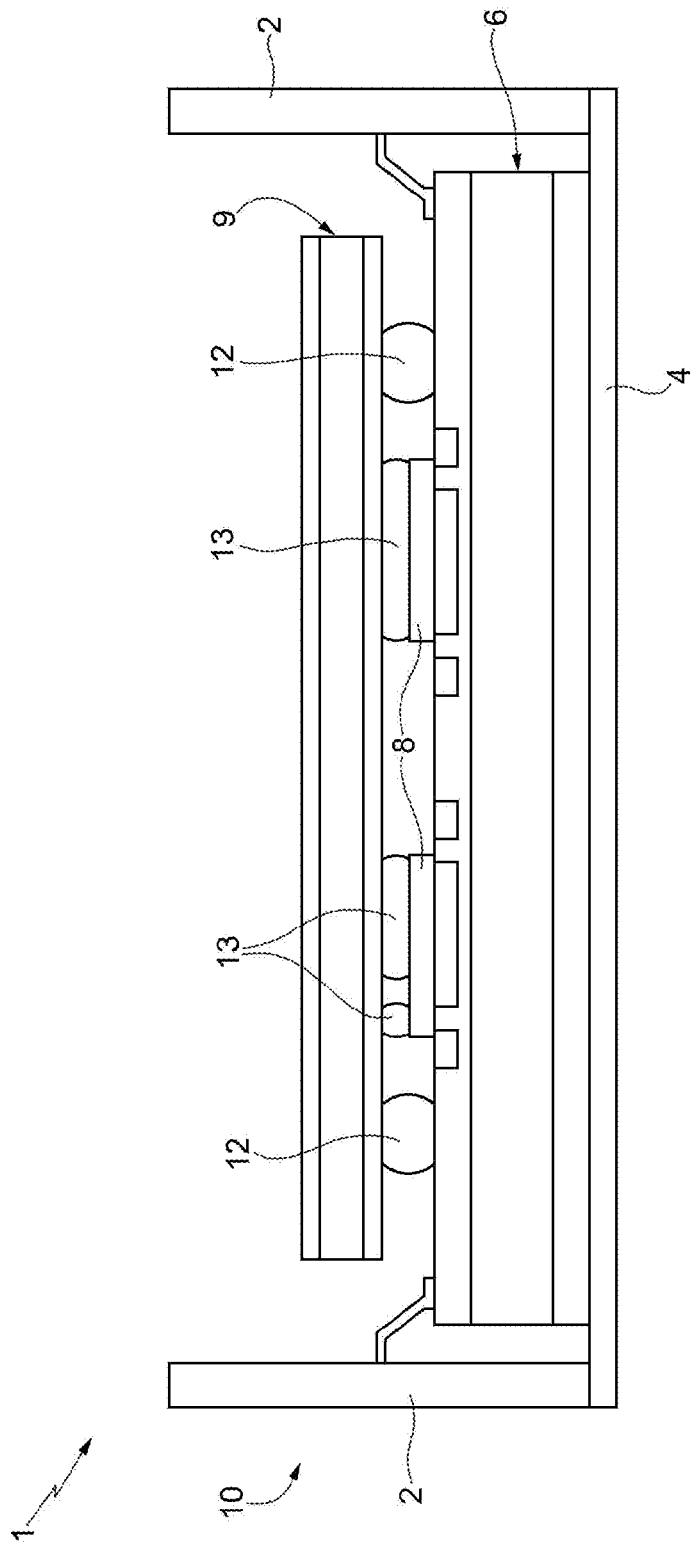
FIG. 1 shows a power module according to an embodiment of a known type.
Figure 2:
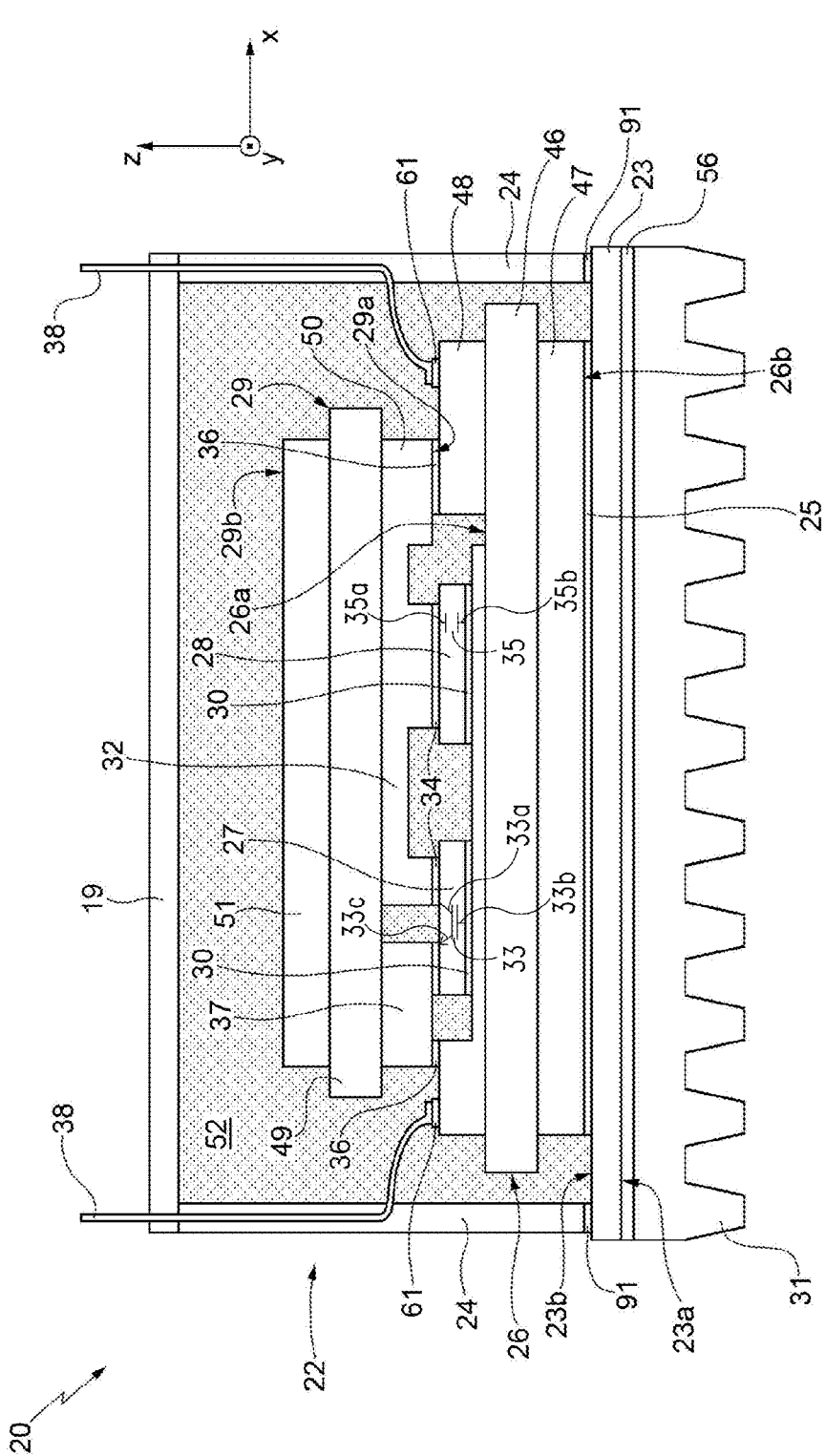
FIG. 2 shows a power module according to an embodiment of the present disclosure.

FIG. 2 shows, in lateral cross-sectional views and in a triaxial system of axes X, Y, Z, a power module (or electronic power device) 20 according to one aspect of the present disclosure.

The power module 20 comprises:

a package 22, including a base plate 23 lying in the plane XY, of electrically and thermally conductive material, for example metal material such as copper, and side walls 24, which extend parallel to the planes XZ and YZ along perimetral portions of the base plate 23; the side walls 24 are of insulating material, for example plastic material;

a bottom substrate 26 obtained with DBC technology thermally coupled to a second face 23b, opposite to the first face 23a, of the base plate 23 by a first coupling region 25 including a sintered paste of electrically and thermally conductive material, in particular a paste including silver;

a first die 27 and a second die 28, which are mechanically and thermally coupled to a face 26a of the bottom substrate 26 by respective second coupling regions 30 including a sintered paste of electrically and thermally conductive material, in particular including silver; and a top substrate 29 obtained with DBC technology, which extends over the first and second dice 27, 28 and has a face 29a mechanically, thermally, and electrically coupled to selective portions of the first and second dice 27, 28 by respective third coupling regions 34 including a sintered paste of electrically and thermally conductive material, for example including silver.

A thermal dissipater 31 may be operatively coupled to a first face 23a of the base plate 23 prior to use of the power module 20. This operation is generally performed by the end user of the power module 20. However, according to different embodiments, the thermal dissipater 31 may be mounted directly by the manufacturer.

According to a further aspect of the present disclosure, the package 22 further comprises a top cap 19, designed to close the package 22 at the top for forming a containment region delimited by the side walls 24, by the base plate 23, and by the top cap 19.

The top substrate 29 has, in a position corresponding to the face 29a, conductive paths obtained for contacting electrical terminals of the first die 27 and connecting electrically one or more of said electrical terminals to respective electrical terminals of the second die. For instance, the first die 27 includes an insulated gate bipolar transistor (IGBT) device 33, the electrical terminals of which comprise a collector region 33a, a gate region 33b, and an emitter region 33b, whereas the second die 28 includes a diode 35 comprising a cathode terminal 35a and an anode terminal 35b. The conductive paths provided on the face 29a of the top substrate 29 have the function, in this example, of connecting the diode of the second die 28 in antiparallel configuration with the IGBT device of the first die 27, i.e., connecting the cathode of the diode to the collector of the IGBT, and the anode of the diode to the emitter of the IGBT.

According to one aspect of the present disclosure, conductive paths are present for forming an electrical connection between the electrical terminals of the IGBT device and the outside of the package 22. Further conductive paths form an electrical connection between the electrical terminals of the diode and the outside of the package 22.

The above conductive paths include:

conductive paths 32, 37 formed on the face 29a of the top substrate 29;

electrical coupling regions 36 (only one of which is illustrated in FIG. 2) between the bottom substrate 26 and the top substrate 29, where the electrical coupling regions 36 include a paste of electrically and thermally conductive sintered material, in particular silver; and conductive paths, which extend over the face 26a of the bottom substrate 26 and connect the electrical coupling regions 36 electrically to terminal pins 38, which in turn extend between the face 26a of the bottom substrate 26 and the outside of the package 22, through the side walls 24.

In this way, the electrical terminals of the IGBT 33 and diode 35 devices integrated in the first and second dice 27, 28 are electrically accessible from outside the package 22.

As has been said, the bottom and top substrates 26, 29 are of a DBC type and each have a respective insulating layer 46, 49 of ceramic material, for example alumina ($Al_2O_3$) or aluminum nitride (AlN). Two metal layers 47 and 48 of copper, in the form of laminas, adhere to opposite sides of the insulating layer 46. Two metal layers 50, 51 of copper (preferably pure copper), in the form of laminas, adhere to opposite sides of the insulating layer 49. Use of ceramic layers 46, 49 as electrical insulators ensures high functional properties that remain stable over time (electrical insulation, thermal dissipation).

Typically, the thickness of the insulating layer 46, 49 is comprised between 0.25 mm and 1 mm, while the thickness of the metal layers 47, 48, 50, 51 is comprised between 0.12 mm and 0.5 mm.

In the embodiment illustrated in FIG. 2, the dice 27, 28 are coupled, at the top, to the metal layer 50 and, at the bottom, to the metal layer 48, through the respective coupling regions 30, 34, as already described. The metal layers 48, 50 are coupled together by the coupling regions 36.

The conductive paths 32, 37 that extend over the face 29a of the top substrate 29 are obtained by etching of the metal layer 50 for exposing portions of the insulating layer 49 and thus delimiting conductive regions, for rendering them electrically insulated from one another. Likewise, also the metal layer 48 of the bottom substrate 26 may be selectively etched to delimit and insulate electrically from one another the regions that house the first and second dice 27, 28, and/or to delimit and insulate electrically the regions of the metal layer 48 used for coupling the terminal pins 38.

Furthermore, according to the embodiment of FIG. 2, the metal layer 48 of the bottom substrate 26 has a recess having a depth less than the thickness of the metal layer 48, which is designed to house the first and second dice 27, 28. The depth of the recess thus formed is such that the first and second dice 27, 28 do not project significantly from the recess in the direction of the axis Z and, thus, the total thickness of the stack formed by the first substrate 26 and by the top substrate 29 and by the first and second dice 27, 28 is represented substantially by the sum of the thicknesses of the first substrate 26 and the top substrate 29.

The bottom and top substrates 26, 29 and the first and second dice 27, 28 are immersed in an electrically insulating packaging silicone gel 52. The silicone gel 52 guarantees top electrical insulation of the metal layer 51, as well as electrical insulation between the dice 27, 28 and the portions, that face them, of the metal layers 48 and 50 belonging to the first substrate 26 and the top substrate 29, respectively. The silicone gel 52 further has the function of protecting the surfaces of the dice, the terminals, and the internal areas of the power module from any contamination, oxidation, and from humidity, as well as of attenuating the vibrations and any possible mechanical shock to which the power module 20 is subject during use.

The thermal dissipater 31 is thermally coupled to the base plate 23 by a layer of thermal-interface material (TIM) 56, for example silicone grease, designed to favor transfer of heat from the bottom substrate 26 to the thermal dissipater 31. The thermal dissipater 31 is mechanically coupled to the base plate 23 by screws (not illustrated in FIG. 2), in a per se known manner.

Figure 3:
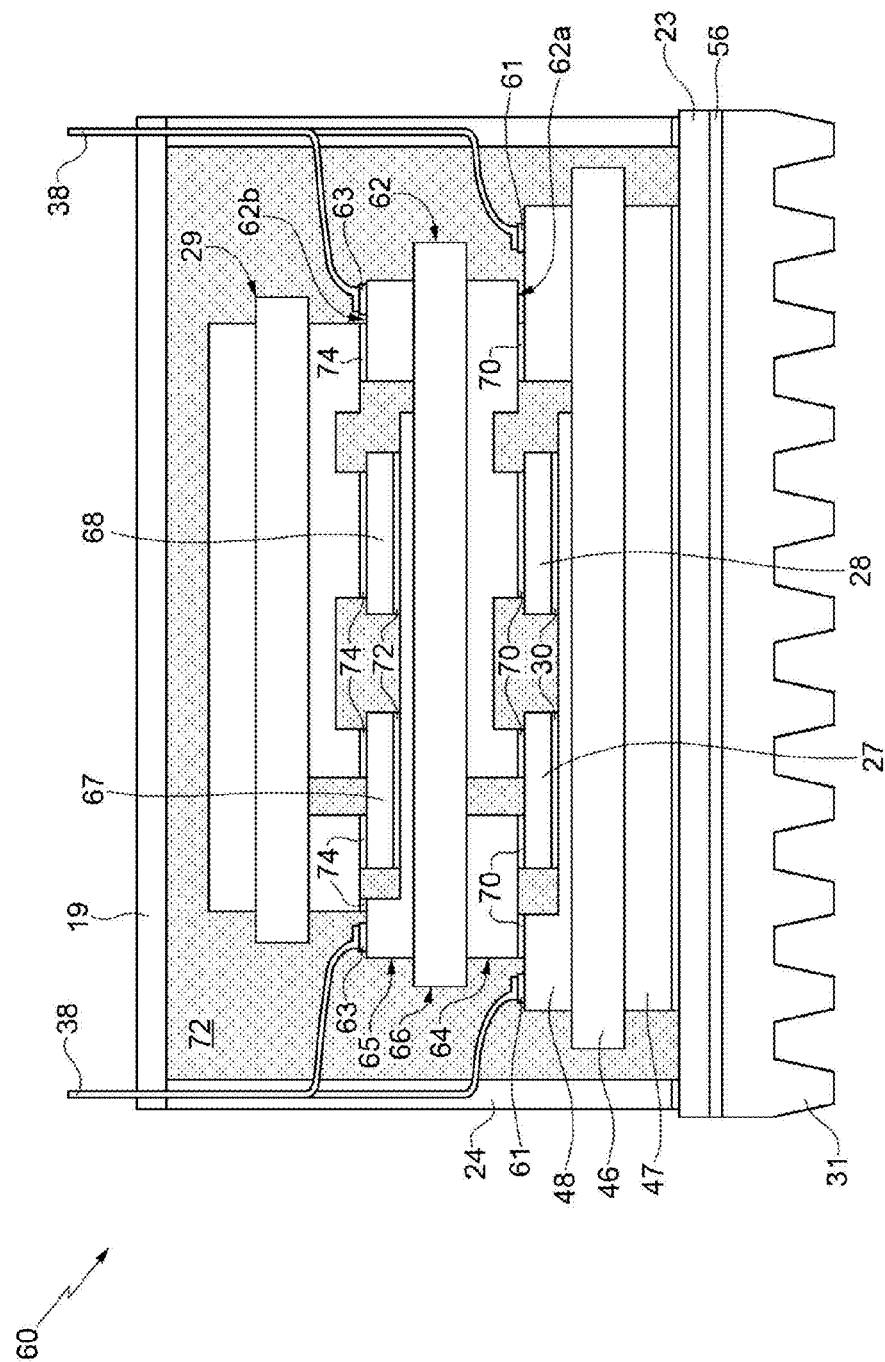
FIG. 3 shows a power module according to a further embodiment of the present disclosure.

FIG. 3 shows a power module 60 according to a further embodiment of the present disclosure. Features of the power module 60 common to those of the power module 20 of FIG. 2 are not described any further and are designated by the same reference numbers.

The power module 60 further comprises an intermediate substrate 62, of a DBC type, arranged between the bottom substrate 26 and the top substrate 29. The intermediate substrate 62 has, according to DBC technology, two metal layers 64, 65, in particular of pure copper, separated by an insulating layer 66 of ceramic material. The intermediate substrate 62 has, in a position corresponding to a bottom face 62a (i.e., in the metal layer 64), conductive paths obtained by etching of the metal layer 64 for exposing portions of the insulating layer 49, thus forming conductive regions insulated from one another. As described previously with reference to the top substrate 29, the conductive paths of the metal layer 64 are coupled to selective regions of the first and second dice 27, 28, for example in order to connect together in antiparallel configuration the respective electronic devices, IGBT and diode, and to form the connections to the terminal pins 38.

The first and second dice 27, 28 are mechanically and thermally coupled to the face 26a of the bottom substrate 26 by the coupling regions 30, comprising a sintered paste of conductive material, which for example includes silver, and are further mechanically, thermally, and electrically coupled to the conductive paths of the intermediate substrate 62 by respective coupling regions 70, comprising a sintered paste of electrically and thermally conductive material, which for example includes silver.

The intermediate substrate 62 further has, on a top face 62b (i.e., in the metal layer 65), a recess designed to house further third and fourth dice 67, 68. As described with reference to the first and second dice 27, 28, the third and fourth dice 67, 68 are mechanically and thermally coupled to the face 62b of the intermediate substrate 62 by coupling regions 72, comprising a sintered paste of electrically and thermally conductive material, which for example includes silver.

The top substrate 29 extends over the intermediate substrate 62 and has, as described previously with reference to FIG. 2, conductive paths mechanically, thermally, and electrically coupled to conductive terminals of the dice 67, 68 by respective coupling regions 74, comprising a sintered paste of electrically and thermally conductive material, which for example includes silver.

A silicone gel 72 covers the first substrate 26, the second substrate 62, and the third substrate 29, as well as the spaces present between them.

The terminal pins 38 extend through the side walls 24 of the package 22. Some terminal pins 38 contact exclusively contact pads 61 present on the bottom substrate 26, whereas other terminal pins 38 contact exclusively the contact pads 63 present on the intermediate substrate 62. The contact pads 61, 63 are formed in peripheral regions of the bottom substrate 26 and of the intermediate substrate 62. For this purpose, to facilitate the operation of assembly of the side walls 24 on the base plate 23 and at the same time to provide the contact between the terminal pins 38 and the substrates 26 and 62, the bottom substrate 26 has a horizontal extension, along the axis X, greater than the horizontal extension, once again along the axis X, of the intermediate substrate 62. In turn, the intermediate substrate 62 has a horizontal extension, along the axis X, greater than the horizontal extension, once again along the axis X, of the top substrate 29. In this way, in top plan view, peripheral portions of the bottom substrate 26 that present contact pads for the terminal pins 38 project laterally from the intermediate substrate 62. Likewise, peripheral portions of the intermediate substrate 62 that present contact pads for the terminal pins 38 project laterally from the top substrate 29. In this way, the side walls 24 may be mounted on the base plate 23 vertically, i.e., by sliding the side walls 24 along the axis Z.

With reference to FIGS. 4-12, a method for manufacturing the power module 20 of FIG. 2 is now described. The method applies, in an obvious way, also to manufacture of the power module 60 of FIG. 3.

Figure 4:
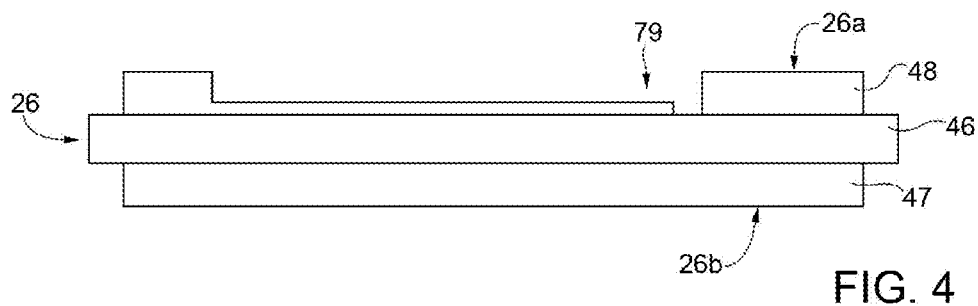
FIGS. 4-12 show steps of manufacture of the power module of FIG. 2.
Figure 5:
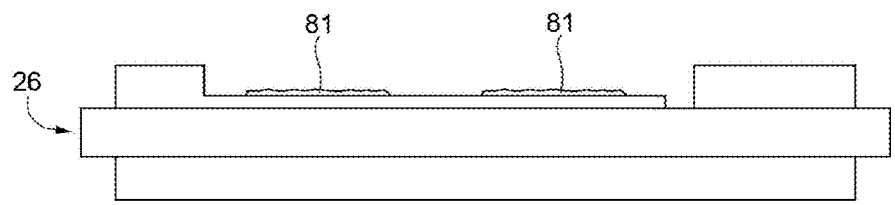

With reference to FIG. 4, the bottom substrate 26, of a DBC type, is provided, which presents a recess 79 for housing the dice 27, 28. DBC substrates are commercially available and are pre-processed (for example, to form the recess 79) by the supplier on the basis of the customer's indications.

Figure 6:
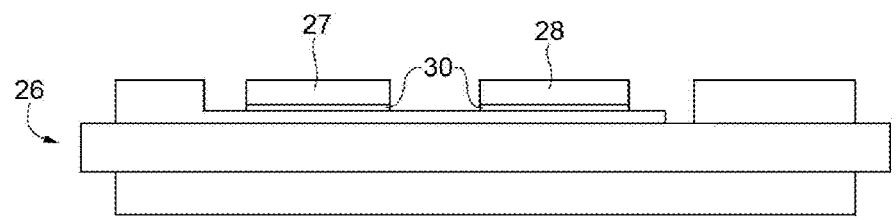

Then (FIG. 5), by the screen-printing technique, or the writing/dispensing technique, first intermediate coupling regions 81 of paste of electrically and thermally conductive material, for example including silver, are formed. The first intermediate coupling regions 81 are formed in the recess 79, and, in subsequent manufacturing steps, after a sintering step, will come to form the coupling regions 30 (FIG. 6). The conductive paste used has, for example, the following characteristics (which vary as a function of the sintering pressure, for example chosen in the 10-MPa to 30-MPa range):

| Thermal conductivity | 150-250 W/m · K |
|---|---|
| Electrical resistance | <0.008 mΩ · cm |
| CTE | 21 ppm/K |
| Elastic modulus | 50-60 GPa |

After a step of drying in an oven has been carried out for approximately 10 min at approximately 100° C., there follows (FIG. 6) a step of placing (using the pick-and-place technique) of the dice 27, 28 for a few seconds at 120-125° C. in a position corresponding to respective intermediate coupling regions 81, and a subsequent step of thermal treatment, with application of pressure, to enable sintering. The sintering step is performed for 1-3 min at a temperature of approximately 230° C. and at a pressure comprised between 10 MPa and 30 MPa.

Next (FIG. 7), the top substrate 29, of a DBC type, is provided. As has been said, DBC substrates are commercially available and are pre-processed by the supplier on the basis of customer's indications. The top substrate 29 has a plurality of trenches etched in the metal layer 50, to form conductive paths electrically insulated from one another. Each conductive path is designed for contacting, when the top substrate 29 is arranged facing the bottom substrate 26, selective portions of the dice 27, 28 (in particular, the electrical terminals of the devices integrated in the dice 27, 28) and of the bottom substrate 26 (in particular, to form the electrical paths from and towards respective terminal pins 38).

There are then formed, using the screen-printing technique, or the writing/dispensing technique, second intermediate coupling regions 84, 86 of paste of electrically and thermally conductive material, in particular including silver. The second intermediate coupling regions 84, 86 are formed on the first die 27 (selectively, i.e., exclusively in area corresponding to electrical terminals of the latter), on the second die 28 (selectively, i.e., exclusively in areas corresponding to electrical terminals of the latter), and in surface regions of the metal layer 48 provided for mechanical and electrical coupling with respective portions of the metal layer 50. In subsequent manufacturing steps, after sintering, the coupling regions 84, 86 will form the coupling regions 34 and 36, respectively.

After a drying step has been carried out in an oven for approximately 10 min at 100° C., a flip-chip step is then performed for coupling the top substrate 29 to the bottom substrate 26.

Then (FIG. 8), a subsequent step of thermal treatment, with application of pressure P, implements the sintering step. In greater detail, this sintering step is performed for a 1-3 min at a temperature of approximately 230° C. and a pressure comprised between 10 and 30 MPa. A stack or sub-assembly 88 is thus formed by the bottom substrate 26, the first and second dice 27, 28, and the top substrate 29, coupled together from a mechanical, thermal, and electrical standpoint by the coupling regions 30, 34, and 36.

Then (FIG. 9), the base plate 23 is provided. Using the screen-printing technique, or writing/dispensing technique, a layer 90 of paste of electrically and thermally conductive material, for example including silver, is formed for a subsequent sintering step.

Figure 8:
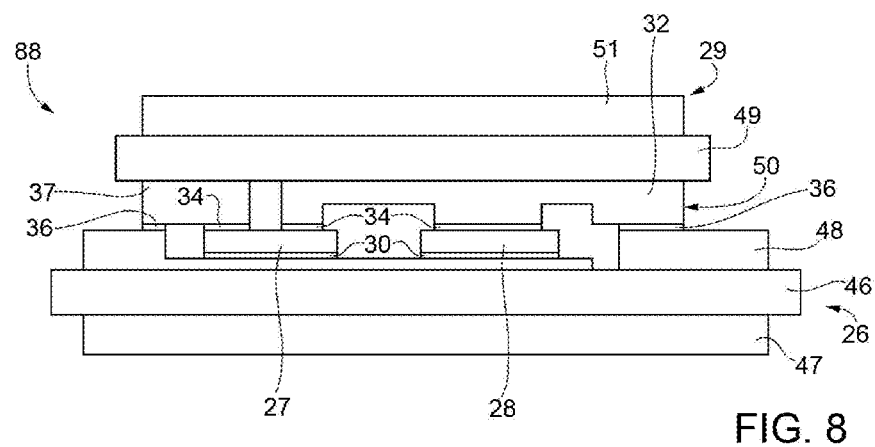
Figure 9:
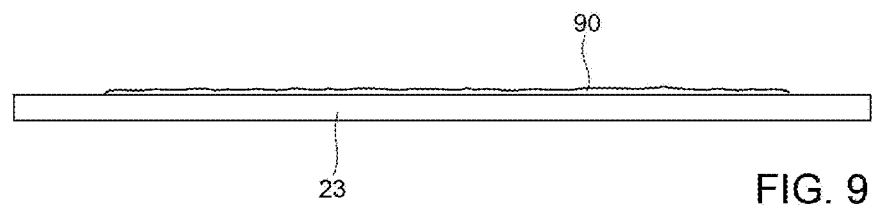
Figure 10:
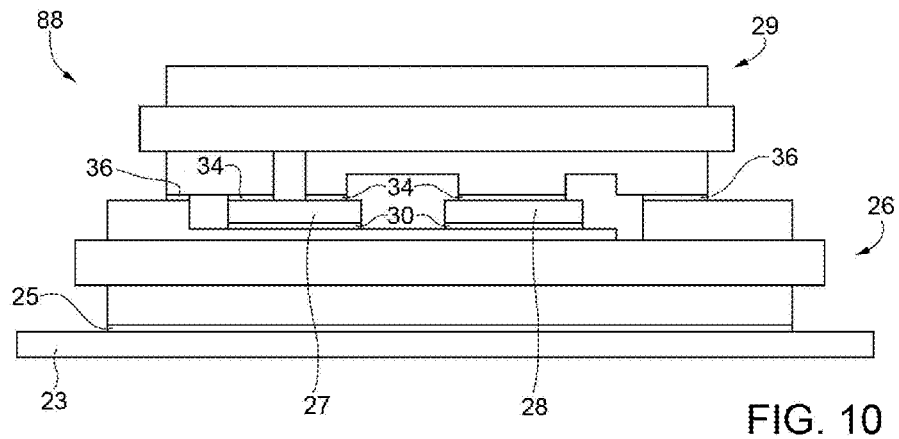
Figure 11:
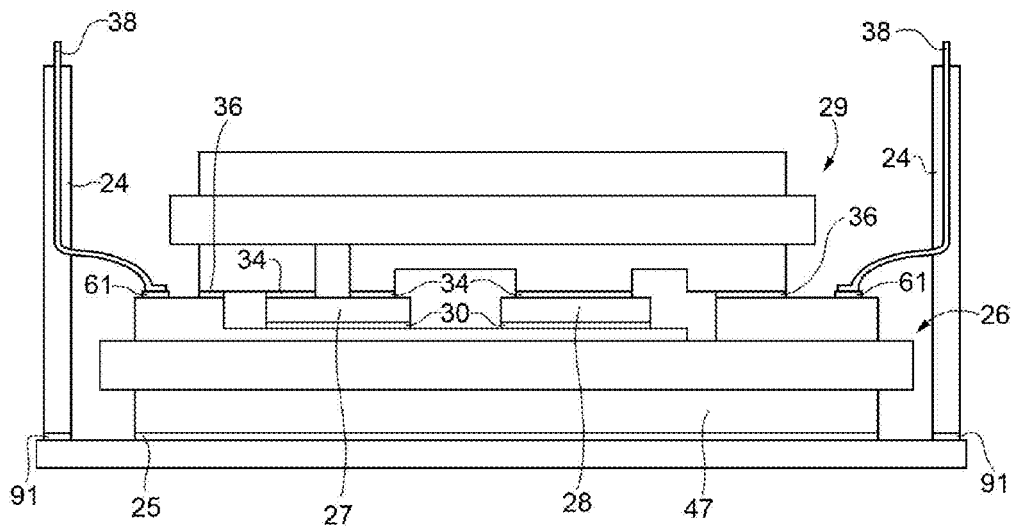
Figure 12:
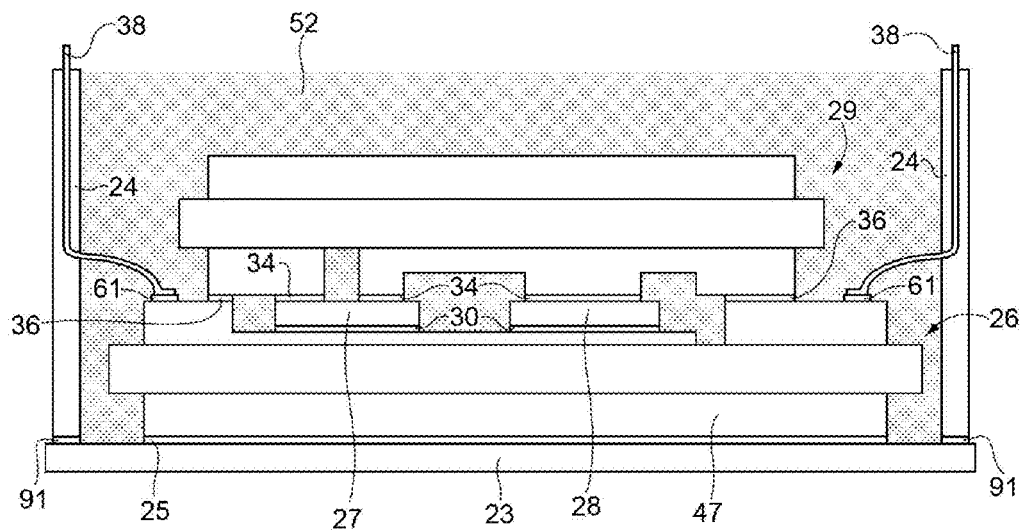

Next (FIG. 10), after a step of drying has been carried out in an oven for approximately 10 min at 100° C., the next step is that of coupling the stack 88 of FIG. 8 to the base plate 23 of FIG. 9, in the region where the layer 90 of conductive paste has been formed.

Then, a subsequent thermal treatment for 1-3 min at a temperature of approximately 230° C. and a pressure comprised between 10 and 30 MPa implements the sintering step. Good adhesion of the stack 88 to the base plate 23 is thus guaranteed, as well as optimal thermal coupling of the stack 88 to the base plate 23 through the coupling region 25 thus formed.

Next (FIG. 11), the side walls 24 are assembled, these walls 24 already being provided with the terminal pins 38. These steps involve depositing a layer of glue 91, for example a silicone glue specific for sealing and protection of electrical components, along a peripheral region of the base plate 23 (or in any case, a region of the base plate 23 that surrounds the stack 88), as well as mounting the side walls 24 (i.e., of the case) on the layer of glue 91. At the same time, the terminal pins 38 are arranged in contact with the regions of the metal layer 48 provided for the purpose, i.e., regions equipped with metal pads 61 for connection, by soldering, with the terminal pins 38.

Next (FIG. 12), poured into the portion of space delimited by the side walls 24 is the packaging silicone gel 52, which is designed to protect the stack 88, along with the elements that make up the stack 88, from any mechanical, thermal, or vibrational shock, as well as from harmful chemical or atmospheric agents, contamination, oxidation, and humidity. The packaging silicone gel 52 covers the stack 88 completely and penetrates into the gaps and cavities present between the bottom substrate 26 and the top substrate 29, surrounding the dice 27, 28.

Then, the cap 19 is mounted, which is typically fixed by sliding the terminal pins into the through holes provided for this purpose and fitted on the outer perimeter 24 of the case.

Likewise, mounting of the dissipater 31 is then carried out, which comprises the step of forming the thermal-interface layer 56, dispensing thermal grease, typically formed by a compound of polymerizable materials (which are highly conductive from the thermal standpoint but poorly conductive from the electrical standpoint), and then by coupling the dissipater 31 to the base plate 23, via the thermal-interface layer 56. The dissipater 31 is kept mechanically coupled to the base plate 23 by screws, in a per se known manner and not illustrated in the figures. The power module 20 of FIG. 2 is thus obtained.

Figure 7:
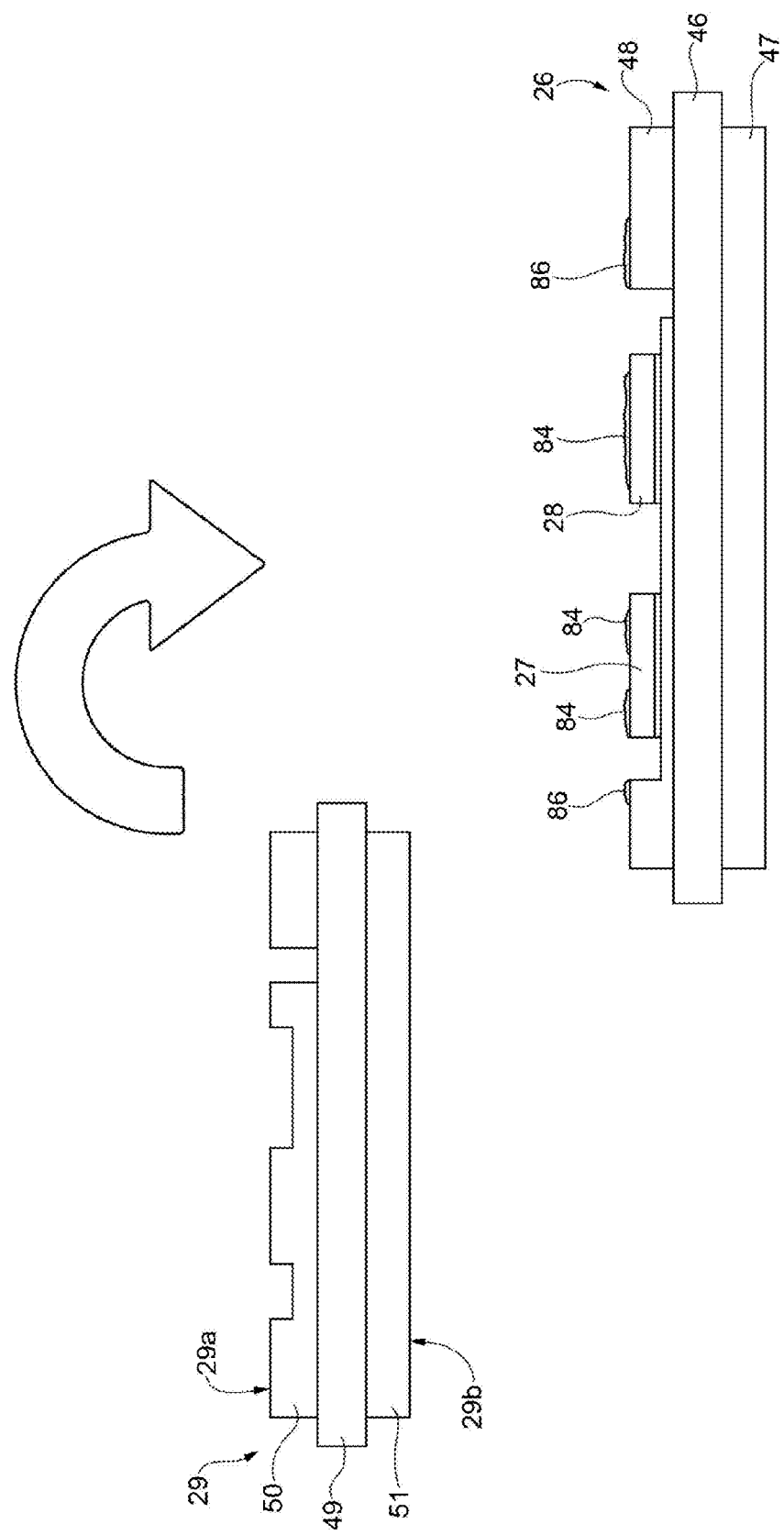

Manufacture of the power module 60 of FIG. 3 is obtained by following the steps of FIGS. 4-12, but the step of FIG. 7 likewise envisages coupling of the further intermediate substrate 62 to the bottom substrate 26 using the flip-chip technique, coupling of the further dice 67, 68 to the intermediate substrate using conductive paste, subsequent sintering for hardening the conductive paste, and coupling of the top substrate 29 to the intermediate substrate 62 using the flip-chip technique.

Figure 13:
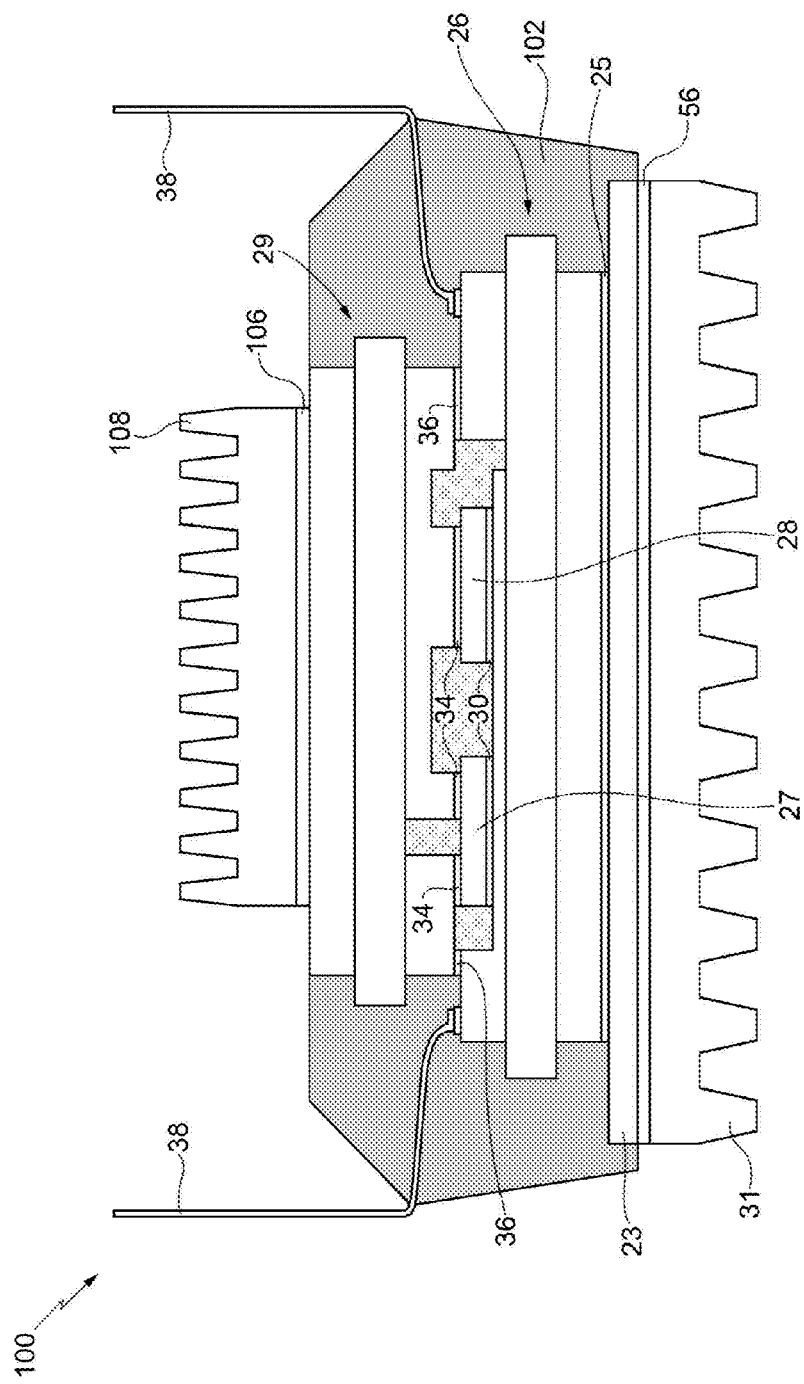
FIGS. 13-16 show power modules according to respective further embodiment of the present disclosure.

FIG. 13 shows a power module 100 according to a further embodiment of the present disclosure.

The power module 100 comprises a stack 88 of the type illustrated in FIG. 8, and obtained as described previously. Elements that are common to the power module 20 of FIG. 2 and the power module 100 of FIG. 13 are designated by the same reference numbers and not described any further.

However, according to the embodiment of FIG. 13, the base plate 23 is not present, nor the side walls 24 and cap 19 that form the outer case of the package 22. In this case, in fact, a package 101 is obtained by subjecting the stack 88, provided with the soldered terminal pins 38, to a molding step, coating completely, by a plastic case 102 obtained by a dedicated mold (typically a mold of epoxy resin, also known as epoxy mold compound—EMC), the lateral portions of the bottom substrate 26 and the top substrate 29. The faces 29b and 26b of the top substrate 29 and of the bottom substrate 26, respectively, are not covered by the plastic case 102 and are thermally coupled, by respective thermal-interface layers 106 and 108, to respective dissipaters 108 and 31.

The terminal pins 38 are not completely covered by the plastic case 102, and project out of the package 101, thus enabling electrical access from outside.

To minimize the presence of possible voids that may not be filled with the resin during the molding step, a silicone gel is dispensed, which by capillarity fills all the gaps and possible voids present after coupling of the substrate 26 to the substrate 29. This step is performed using dispensing techniques (possibly vacuum-assisted) after coupling of the two substrates 26 and 29 and before the molding step.

Figure 14:
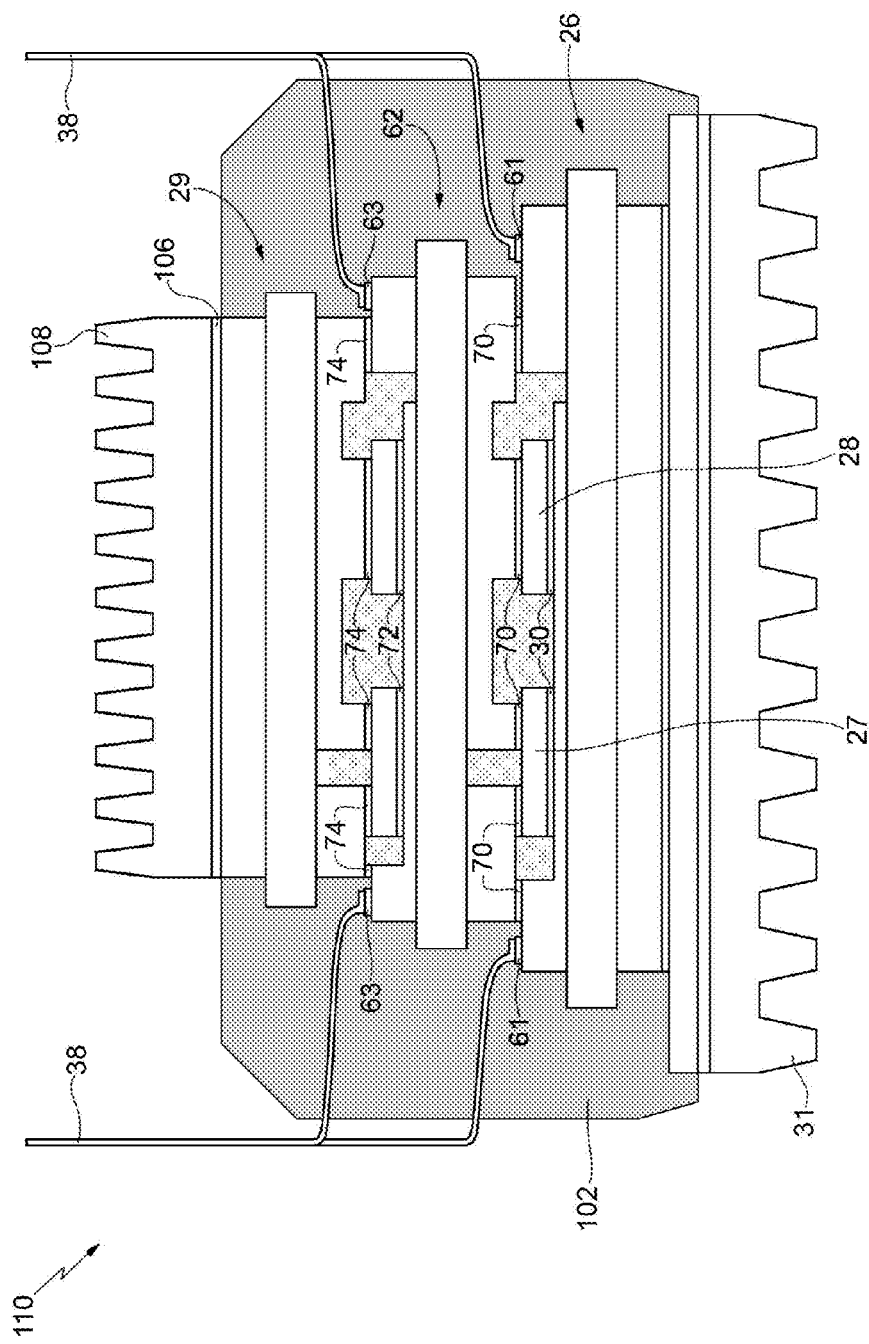

FIG. 14 shows a power module 110 according to a further embodiment of the present disclosure. The power module 110 is similar to the power module 100 of FIG. 13; i.e., it has a package formed by a plastic case 102 obtained by molding; however, in this case, the power module 110 further comprises the intermediate substrate 62, of a DBC type, which extends between the first substrate 26 and the top substrate 29, as already illustrated and described with reference to FIG. 3 and not described any further herein.

The power modules 20, 60, 100, and 110 described previously are designed to be mounted on a printed circuit board (PCB) that houses the circuits necessary for control of the power modules 20, 60, 100, and 110. However, according to a further embodiment, the control circuits of the power modules 100 and 110 of FIGS. 13 and 14 may be integrated, at least in part, within the package itself.

Figure 15:
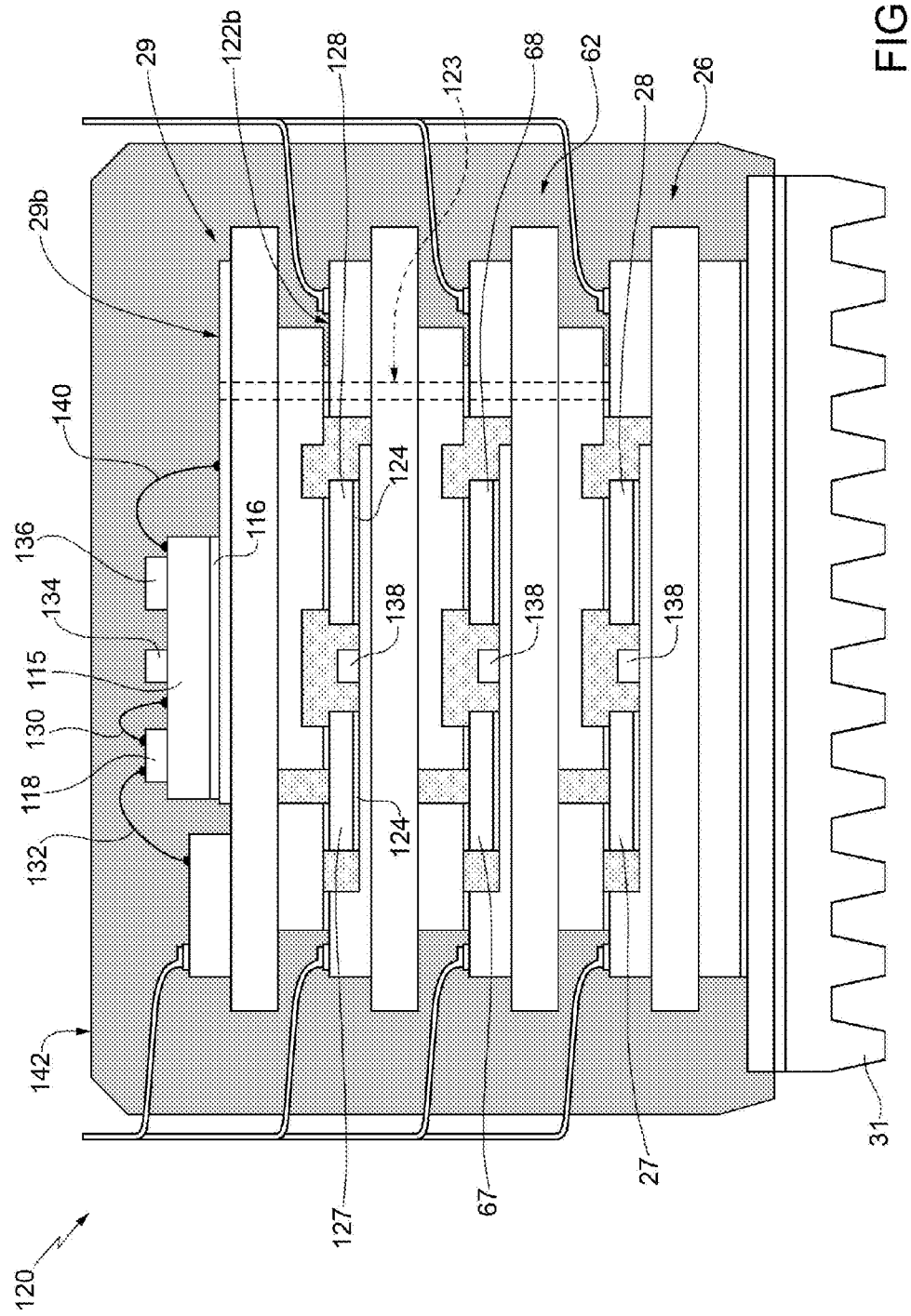

FIG. 15 shows, by way of example, a power module 120 having the intermediate substrate 62 and a further intermediate substrate 122, arranged between the intermediate substrate 62 and the top substrate 29 in a way similar to what has already been described previously with reference to the intermediate substrate 62. The intermediate substrate 122 further has, on a top face 122b thereof, a recess designed to house a further fifth die 127 and a further sixth die 128. As described with reference to the first and second dice 27, 28, the fifth and sixth dice 127, 128 are mechanically and thermally coupled to the face 122b of the intermediate substrate 122 by coupling regions 124, comprising an electrically and thermally conductive sintered paste material, which in particular includes silver.

A power module of this type, which has three IGBTs, with the respective diodes connected in antiparallel configuration, may be used, for example, as an intelligent power module (IPM).

The top substrate 29 extends over the intermediate substrate 122 and has (as already described previously) conductive paths (not illustrated) mechanically, thermally, and electrically coupled to conductive terminals of the dice 127, 128 by respective coupling regions 129, comprising a sintered paste of electrically and thermally conductive material, which in particular includes silver.

The top face 29b of the top substrate 29 houses a printed circuit board (PCB) 115, mechanically coupled to the top face 29b by a layer of non-conductive epoxy glue 116. The PCB 115 in turn houses a driving device 118, configured to drive the IGBTs integrated in the dice 27, 67, and 127. The driving device 118 is operatively connected to the PCB 115 by bonding wires 130, and is operatively connected to the dice 27, 67, and 127 by bonding wires 132 and respective through vias (not illustrated) formed through the top substrate 29 and the intermediate substrates 62, 122.

The PCB 115 further, optionally, houses a temperature sensor 134 and/or further passive elements 136 (resistors, capacitors, etc.), which have the function of capacitive and RC filters (in a per se known manner and not forming the subject of the present disclosure).

Furthermore, additional temperature sensors 138 may be arranged in the recess that houses the dice 27, 28, in the recess that houses the dice 67, 68, and in the recess that houses the dice 127, 128. The temperature sensors 138 are electrically connected to the PCB 115 by through vias (a through via 123 is represented by way of example with a dashed line) formed through the top substrate 29 and the intermediate substrates 62, 122 and by bonding wires 140, which extend between the PCB 115 and the surface 29b of the top substrate 29.

The power module 120 of FIG. 15 has a package formed by a plastic case 142 obtained by molding, which extends alongside the substrates 26, 62, 122, 29 and on top of the substrate 29. Consequently, in this case only the dissipater 31 is present, which is thermally coupled to the bottom substrate 26.

Terminal pins 139 extend through the plastic case 142 and are in electrical contact (e.g., by soldering) with the bottom substrate 26, the intermediate substrate 62, the intermediate substrate 122, and the top substrate 29.

According to a further embodiment (illustrated in FIG. 16), a power module 150 includes a plurality of driving devices 152, each arranged in a respective recess of the bottom substrate 26, the intermediate substrate 62, and the intermediate substrate 122 that houses the respective die 27, 67, 127 integrating the IGBT. Each driving device 152 is configured to control and drive the respective IGBT device. Each driving device 152 is electrically connected to the respective IGBT device by one or more bonding wires 156 and by conductive paths, insulated from one another, obtained in the metal layer of the respective substrate 26, 62, 122 by etching the metal layer of the respective substrate 26, 62, 122 until the underlying insulating layer is reached, thus defining appropriate conductive paths. Each recess of the bottom substrate 26, of the intermediate substrate 62, and of the intermediate substrate 122 optionally houses a respective temperature sensor 160.

According to the embodiment of FIG. 16, the face 29b of the top substrate 29 does not house the PCB 115 and is thus free to be coupled to a thermal dissipater 108, as already illustrated in FIG. 13 and described with reference thereto.

With reference to FIG. 15, it may be noted that the PCB 115 may be electrically coupled to the top substrate 29 using the technology deemed most appropriate. Possible technologies include wire bonding or solder-ball bonding. Likewise, the driving device 118 and the temperature sensor 134 may be electrically coupled to the PCB 115 using the most appropriate technology, chosen from between wire bonding or bonding with conductive solder paste (for example, a sintered paste).

Figure 16:
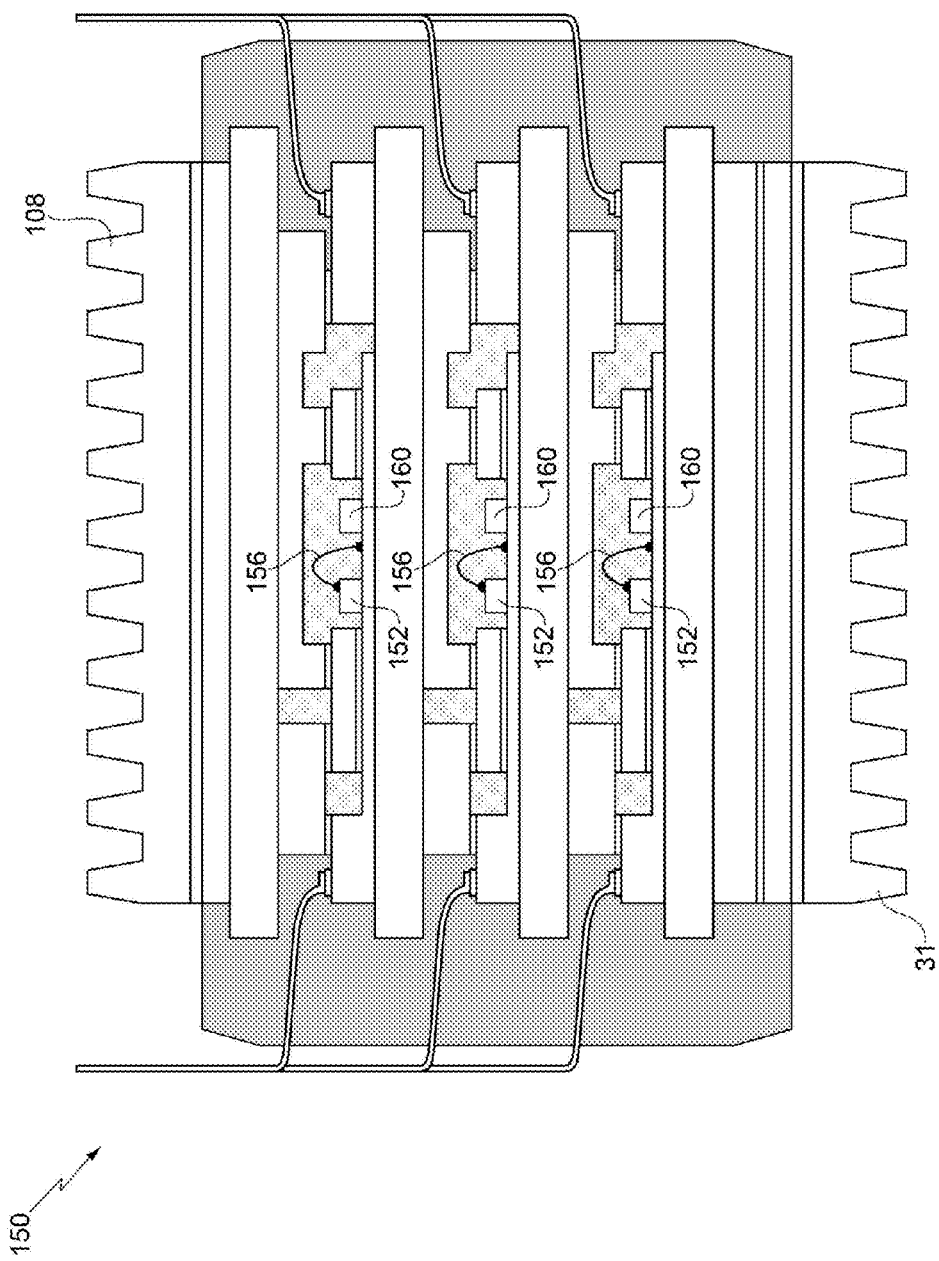

Likewise, with reference to FIG. 16, the driving devices 152 may be electrically coupled to the respective substrate using a technology chosen from between wire bonding or solder-ball bonding, while the temperature sensors 160 are coupled to the respective substrates 26, 62, 122 using conductive solder paste (for example, a sintered paste).

What has been presented in the foregoing description finds application, for example, in the manufacture of a half-bridge power module, including a high-side IGBT, and a low-side IGBT, each of which is connected in antiparallel to a respective diode, as discussed previously. The IGBT device, whether low-side or high-side, has the function of a power switch, and the diode is the freewheeling diode (FWD).

Other applications may regard three-phase power modules of a six-pack type that include six IGBTs and FWDs.

Figure 17:
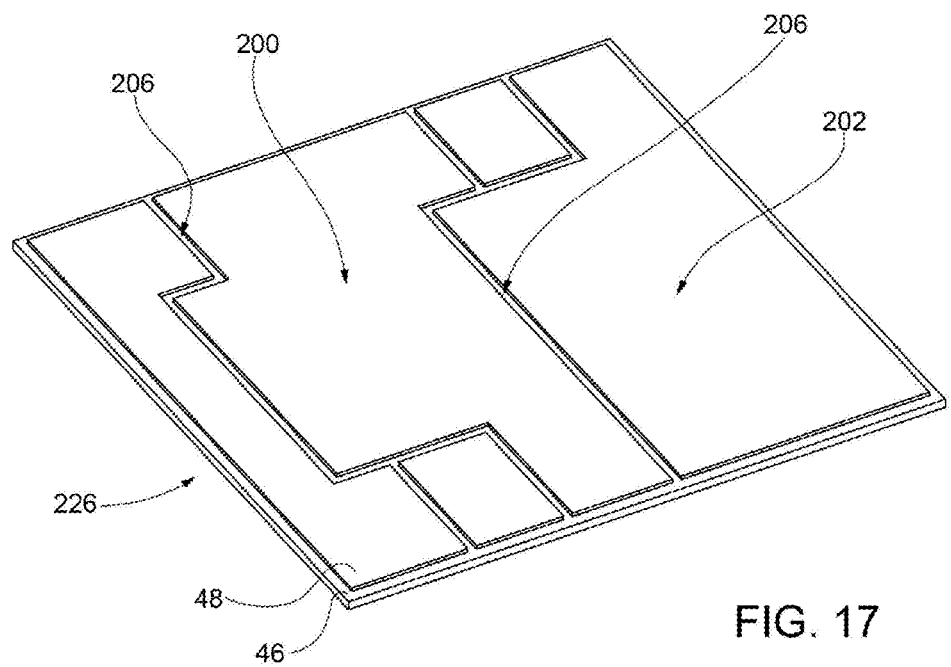
FIG. 17 shows, in top perspective view, a substrate of a DBC type.

FIG. 17 shows, in top perspective view, a substrate 226, of a DBC type, presenting two recesses 200, 202 designed to house each a respective die integrating an IGBT and a respective die integrating a diode. The recesses are obtained in the top metal layer 248 of the substrate 226. According to what has already been noted regarding DBC technology, the metal substrate 248 extends over an insulating layer 246. By appropriate connections obtained by forming conductive paths in the metal layer of the DBC substrate (not illustrated) that extends immediately over the bottom substrate (according to the embodiments of the stack 88 already discussed), it is possible to connect together the IGBTs and the diodes to provide the electrical configuration of FIG. 18 (half-bridge configuration). As may be noted from FIG. 17, the recesses 200, 202 are electrically insulated from one another by trenches 206 obtained by etching the metal layer 248 until the underlying insulating layer 246 is reached.

Figure 18:
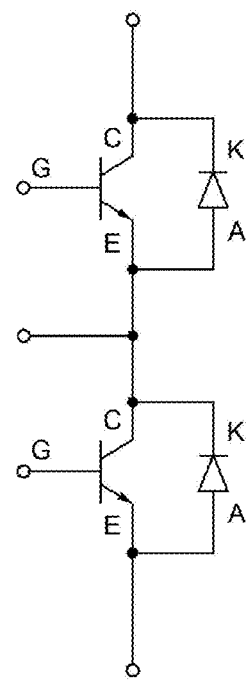
FIG. 18 shows a half-bridge configuration of IGBTs and diodes.
Figure 19:
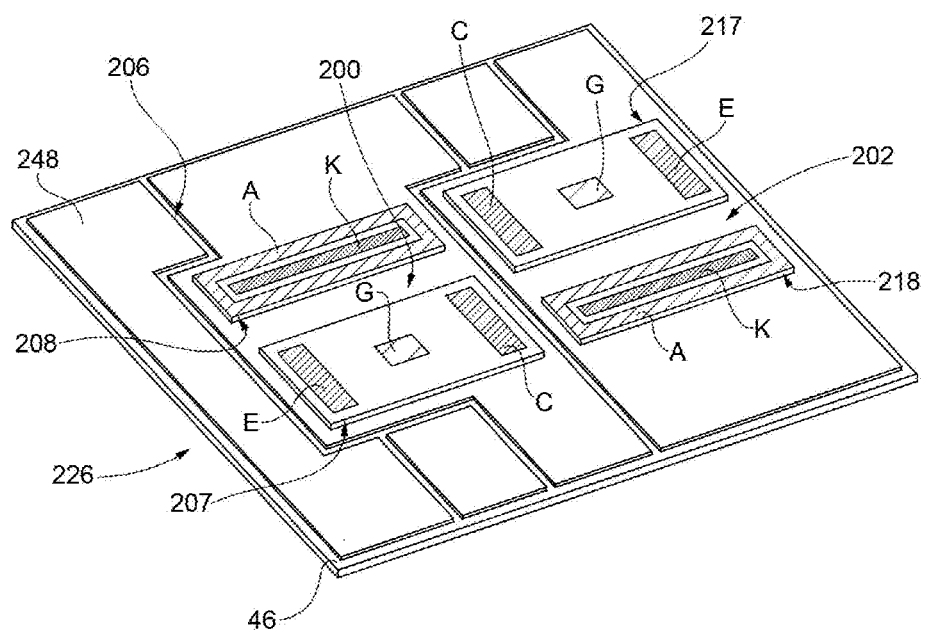
FIG. 19 shows dice housed in recesses of the substrate of FIG. 17.

FIG. 19 shows two dice 207 and 208 housed in the recess 200, and further dice 217, 218 housed in the recess 202. The dice 207 and 217 each integrate an IGBT, each of which is provided with a collector terminal C, an emitter terminal E, and a gate terminal G as shown in FIG. 18. The dice 208 and 218 each integrate a diode provided with a respective cathode terminal K and a respective anode terminal A. All the terminals are accessible from the top so that they may be contacted by conductive paths of the substrate (not illustrated) that extends over the substrate 226, by interposition of the layer of sintered paste.

The advantages that may be obtained with the disclosure disclosed herein emerge clearly from the foregoing description.

In particular, the disclosure according to the present disclosure enables a high level of integration, high reliability, and high density of components to be achieved.

Finally, it is clear that numerous modifications and variations may be made to what has been described and illustrated herein, all of which fall within the scope of the present disclosure.

In particular, the number of substrates that make up the stack 88, according to any of the embodiments illustrated, may be greater or smaller than what has been described and illustrated in the figures; in particular, it may be chosen according to the need as a function of the specific application and of the necessary number of dice (electronic components).

Furthermore, the IGBT and the diode may be connected together in parallel, and not in antiparallel as described previously.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic power module comprising:
a case; and
a stack housed by the case and including:
a first substrate, including a first top metal region, a first bottom metal region, and a first insulating region arranged between the first top metal region and the first bottom metal region;
a first die integrating a first electronic component having one or more electrical-conduction terminals, the first die being mechanically and thermally coupled to a first face of the first substrate;
a second substrate, including a second top metal region, a second bottom metal region, and a second insulating region arranged between the second top metal region and the second bottom metal region, the second substrate extending over the first substrate and over the first die and having a first conductive path in the second bottom metal region;
a first coupling region of a sintered thermoconductive paste mechanically and thermally coupling the first die to the first substrate; and
a second coupling region of sintered thermoconductive paste mechanically, electrically, and thermally coupling said one or more electrical-conduction terminals of the first electronic component to the first conductive path of the second substrate,
wherein the first top metal region, first bottom metal region, and first insulating region of the first substrate have an area greater than an area of the second top metal region, second bottom metal region, and second insulating region of the second substrate.

2. The electronic power module according to claim 1, wherein said first coupling region and said second coupling region are sintered layers of silver.

3. The electronic power module according to claim 1, further comprising a third coupling region of sintered thermoconductive paste directly coupling the first substrate, from a mechanical, electrical, and thermal standpoint, to the second substrate.

4. The electronic power module according to claim 1, further comprising:
a base plate of electrically and thermally conductive material, thermally coupled to the first substrate; and
a thermal dissipater thermally coupled to the base plate.

5. The electronic power module according to claim 1, wherein said case comprises a plastic case of an epoxy resin, which laterally surrounds said stack, exposing a top face of the stack and a bottom face of the stack, the electronic power module further comprising:
a first thermal dissipater thermally coupled to said top face of the stack; and
a second thermal dissipater thermally coupled to said bottom face of the stack.

6. The electronic power module according to claim 1, wherein the stack includes:
a third substrate, including a third top metal region, a third bottom metal region, and a third insulating region arranged between the third top metal region and the third bottom metal region, the third substrate extending underneath the first substrate and presented a recess in the third top metal region;
a second die and a third die, which are housed in said recess in the third top metal region of the third substrate and integrate respective electronic components, which have respective conduction terminals;

a third coupling region of a sintered thermoconductive paste mechanically and thermally coupling the second die to the third substrate; and a fourth coupling region of sintered thermoconductive paste mechanically, electrically, and thermally coupling the conduction terminals of the electronic components integrated in the second and third dice to conductive paths, which extend in the bottom metal region of the first substrate.

7. The electronic power module according to claim 1, further comprising a driving device for driving the first electronic component, the driving device being arranged between the first and second substrates.

8. An electronic power module comprising:
a case; and
a stack housed by the case and including:
a first substrate, including a first top metal region, a first bottom metal region, and a first insulating region arranged between the first top metal region and the first bottom metal region;
a first die integrating a first electronic component having one or more electrical-conduction terminals, the first die being mechanically and thermally coupled to a first face of the first substrate;
a second substrate, including a second top metal region, a second bottom metal region, and a second insulating region arranged between the second top metal region and the second bottom metal region, the second substrate extending over the first substrate and over the first die and having a first conductive path in the second bottom metal region;
a first coupling region of a sintered thermoconductive paste mechanically and thermally coupling the first die to the first substrate; and
a second coupling region of sintered thermoconductive paste mechanically, electrically, and thermally coupling said one or more electrical-conduction terminals of the first electronic component to the first conductive path of the second substrate; and
a third coupling region of sintered thermoconductive paste directly coupling the first substrate, from a mechanical, electrical, and thermal standpoint, to the second substrate, wherein:
the first substrate has at least one conductive pad,
the case includes a terminal pin soldered to the at least one conductive pad, said terminal pin forming an electrical connection between a region inside said case and a region outside said case, and
said first conductive path of the second substrate is further electrically coupled to the conductive pad of the first substrate by the third coupling region of sintered thermoconductive paste.

9. The electronic power module according to claim 1, wherein the top metal region of the first substrate has a recess, said first die being housed in said recess.

10. The electronic power module according to claim 8, wherein the first top metal region, first bottom metal region, and first insulating region of the first substrate have an area greater than an area of the second top metal region, second bottom metal region, and second insulating region of the second substrate.

11. The electronic power module according to claim 8, wherein said stack further comprises a printed circuit board including a device for driving the first electronic component, the printed circuit board being mechanically coupled to the top metal region of the second substrate and operatively coupled to the first electronic component through a through conductive via formed through the second substrate.

12. An electronic power module comprising:
a case; and
a stack housed by the case and including:
a first substrate, including a first top metal region, a first bottom metal region, and a first insulating region arranged between the first top metal region and the first bottom metal region;
a first die integrating a first electronic component having one or more electrical-conduction terminals, the first die being mechanically and thermally coupled to a first face of the first substrate, wherein the top metal region of the first substrate has a recess, said first die being housed in said recess;
a second substrate, including a second top metal region, a second bottom metal region, and a second insulating region arranged between the second top metal region and the second bottom metal region, the second substrate extending over the first substrate and over the first die and having a first conductive path in the second bottom metal region;
a first coupling region of a sintered thermoconductive paste mechanically and thermally coupling the first die to the first substrate;
a second coupling region of sintered thermoconductive paste mechanically, electrically, and thermally coupling said one or more electrical-conduction terminals of the first electronic component to the first conductive path of the second substrate;
a second die, which is housed in said recess and integrates a second electronic component having one or more conduction terminals, and
a third coupling region of a sintered thermoconductive paste, the second die being mechanically and thermally coupled to the top metal region of the first substrate by the third coupling region of a sintered thermoconductive paste, and wherein one of the conduction terminals of the second electronic component integrated in the second die is mechanically, electrically, and thermally coupled to the first conductive path of the second substrate.

13. The electronic power module according to claim 12, wherein:
the first electronic component of the first die is an insulated gate bipolar transistor (IGBT) having a collector terminal and an emitter terminal,
the second electronic device of the second die is a diode having a cathode terminal and an anode terminal,
the second substrate further has a second conductive path, electrically insulated from the first conductive path and electrically coupling the emitter terminal to the anode terminal, and
said first conductive path electrically couples the collector terminal to the cathode terminal, thus forming a connection in antiparallel of the diode and of the IGBT.

14. An electronic power module comprising:
a case; and
a stack housed by the case and including:
a first substrate, including a first top metal region, a first bottom metal region, and a first insulating region arranged between the first top metal region and the first bottom metal region;
a first die integrating a first electronic component having one or more electrical-conduction terminals, the first die being mechanically and thermally coupled to a first face of the first substrate;

a second substrate, including a second top metal region, a second bottom metal region, and a second insulating region arranged between the second top metal region and the second bottom metal region, the second substrate extending over the first substrate and over the first die and having a first conductive path in the second bottom metal region;

a first coupling region of a sintered thermoconductive paste mechanically and thermally coupling the first die to the first substrate; and a second coupling region of sintered thermoconductive paste mechanically, electrically, and thermally coupling said one or more electrical-conduction terminals of the first electronic component to the first conductive path of the second substrate, wherein said stack further comprises a printed circuit board including a device for driving the first electronic component, the printed circuit board being mechanically coupled to the top metal region of the second substrate and operatively coupled to the first electronic component through a through conductive via formed through the second substrate.

15. The electronic power module according to claim 14, further comprising at least one temperature sensor mechanically coupled between the first and second substrates.

16. The electronic power module according to claim 14, wherein the first top metal region, first bottom metal region, and first insulating region of the first substrate have an area greater than an area of the second top metal region, second bottom metal region, and second insulating region of the second substrate.

17. An electronic power module comprising:
a case; and
a stack housed by the case and including:
    a first substrate including a top metal region;
    a first die integrating a first electronic component having one or more electrical-conduction terminals, the first die being mechanically and thermally coupled to a first face of the first substrate;
    a second substrate including a bottom metal region, the second substrate extending over the first substrate and over the first die and having a first conductive path in the bottom metal region;
    a first coupling region of a sintered thermoconductive paste mechanically and thermally coupling the first die to the first substrate;
    a second coupling region of sintered thermoconductive paste mechanically, electrically, and thermally coupling said one or more electrical-conduction terminals of the first electronic component to the first conductive path of the second substrate; and
    a third substrate including a top metal region, the third substrate extending underneath first substrate and presented a recess in the third top metal region;
    a second die and a third die, which are housed in said recess in the top metal region of the third substrate and integrate respective electronic components, which have respective conduction terminals;
    a third coupling region of a sintered thermoconductive paste mechanically and thermally coupling the second die to the third substrate; and
    a fourth coupling region of sintered thermoconductive paste mechanically, electrically, and thermally coupling the conduction terminals of the electronic components integrated in the second and third dice to conductive paths, which extend in a bottom metal region of the first substrate.

18. The electronic power module according to claim 17, wherein said case comprises a plastic case of an epoxy resin, which laterally surrounds said stack, exposing a top face of the stack and a bottom face of the stack, the electronic power module further comprising:
a first thermal dissipater thermally coupled to said top face of the stack; and
a second thermal dissipater thermally coupled to said bottom face of the stack.

19. The electronic power module according to claim 17, wherein the first die is mechanically and thermally coupled to a first face of the second substrate.

20. An electronic power module comprising:
a case; and
a stack housed by the case and including:
    a first substrate including a top metal region;
    a first die integrating a first electronic component having one or more electrical-conduction terminals, the first die being mechanically and thermally coupled to a first face of the first substrate;
    a second substrate including a bottom metal region, the second substrate extending over the first substrate and over the first die and having a first conductive path in the bottom metal region;
    a first coupling region of a sintered thermoconductive paste mechanically and thermally coupling the first die to the first substrate; and
    a second coupling region of sintered thermoconductive paste mechanically, electrically, and thermally coupling said one or more electrical-conduction terminals of the first electronic component to the first conductive path of the second substrate, wherein said stack further comprises a printed circuit board including a device for driving the first electronic component, the printed circuit board being mechanically coupled to the top metal region of the second substrate and operatively coupled to the first electronic component through a through conductive via formed through the second substrate.

* * * * *